(12) United States Patent
Aikawa et al.

(10) Patent No.: US 10,276,413 B2
(45) Date of Patent: Apr. 30, 2019

(54) LASER PROCESSING APPARATUS

(71) Applicant: DISCO CORPORATION, Tokyo (JP)

(72) Inventors: Chikara Aikawa, Tokyo (JP); Yuki Ogawa, Tokyo (JP); Hirokazu Matsumoto, Tokyo (JP)

(73) Assignee: DISCO CORPORATION, Tokyo (JP)

(*) Notice: Subject to any disclaimer, the term of this patent is extended or adjusted under 35 U.S.C. 154(b) by 210 days.

(21) Appl. No.: 14/678,328

(22) Filed: Apr. 3, 2015

(65) Prior Publication Data

US 2015/0283650 A1   Oct. 8, 2015

(30) Foreign Application Priority Data

Apr. 7, 2014   (JP) .................. 2014-078505

(51) Int. Cl.
| | | |
|---|---|---|
| *B23K 26/16* | (2006.01) | |
| *B23K 26/03* | (2006.01) | |
| *B23K 26/06* | (2014.01) | |
| *B23K 26/14* | (2014.01) | |
| *B23K 26/142* | (2014.01) | |

(Continued)

(52) U.S. Cl.
CPC ...... *H01L 21/67115* (2013.01); *B23K 26/032* (2013.01); *B23K 26/0622* (2015.10); *B23K 26/0648* (2013.01); *B23K 26/0853* (2013.01); *B23K 26/0876* (2013.01); *B23K 26/142* (2015.10); *B23K 26/1476* (2013.01); *B23K 26/16* (2013.01); *B23K 26/364* (2015.10); *H01L 21/67092* (2013.01); *B23K 2101/40* (2018.08); *B23K 2103/50* (2018.08)

(58) Field of Classification Search
CPC ......... H01L 21/67115; H01L 21/67092; B23K 26/0622; B23K 26/142; B23K 26/032; B23K 26/0648; B23K 26/0876; B23K 26/1476; B23K 26/16; B23K 26/402
USPC ............... 219/121.8, 261, 494, 61.12, 78.14, 219/121.6–121.86
See application file for complete search history.

(56) References Cited

U.S. PATENT DOCUMENTS

| | | | | |
|---|---|---|---|---|
| 5,043,548 A | * | 8/1991 | Whitney | ............... B05B 7/1486 219/121.47 |
| 6,683,277 B1 | * | 1/2004 | Millard | ................ B23K 26/123 219/121.84 |

(Continued)

FOREIGN PATENT DOCUMENTS

| | | | |
|---|---|---|---|
| JP | 09-192870 | 7/1997 | |
| JP | 2010-272697 | 12/2010 | |
| JP | WO 2012165393 A1 | * 12/2012 | ............. C22C 38/02 |

*Primary Examiner* — Ibrahime A Abraham
*Assistant Examiner* — Chris Q Liu
(74) *Attorney, Agent, or Firm* — Greer Burns & Crain, Ltd.

(57) ABSTRACT

A laser processing apparatus includes a melt processing unit for processing a melt formed by laser processing, the melt processing unit being disposed downstream of a condenser in a laser beam irradiating direction. The melt processing unit includes a gas injecting section having an opening allowing the passage of a laser beam applied from the condenser, the gas injecting section injecting high-speed gas from the opening to a workpiece, and a melt sucking section having a suction port disposed so as to surround the opening of the gas injecting section, the suction port sucking the melt scattered by the high-speed gas injected from the opening. The gas injecting section is connected to high-pressure gas supply source, and the melt sucking section is connected to melt sucking unit.

15 Claims, 6 Drawing Sheets

(51) Int. Cl.
*B23K 26/08* (2014.01)
*H01L 21/67* (2006.01)
*B23K 26/364* (2014.01)
*B23K 26/0622* (2014.01)
*B23K 101/40* (2006.01)
*B23K 103/00* (2006.01)

(56) References Cited

U.S. PATENT DOCUMENTS

| | | | |
|---|---|---|---|
| 7,057,136 B2* | 6/2006 | Sekiya | B23K 26/1476 219/121.6 |
| 7,334,971 B2* | 2/2008 | Benedetti | B23Q 11/0046 408/67 |
| 2002/0179582 A1* | 12/2002 | Reichmann | B23K 26/0665 219/121.84 |
| 2004/0226927 A1* | 11/2004 | Morikazu | B23K 26/123 219/121.84 |
| 2007/0051710 A1* | 3/2007 | Odanaka | B08B 15/04 219/121.84 |
| 2011/0042362 A1* | 2/2011 | Maehara | B23K 26/142 219/121.67 |
| 2012/0145683 A1* | 6/2012 | Miyagi | B23K 26/147 219/121.64 |
| 2013/0319325 A1* | 12/2013 | Whitfield | B23K 26/34 118/620 |
| 2014/0305917 A1* | 10/2014 | Gadd | B23K 26/36 219/121.72 |

\* cited by examiner

LASER PROCESSING APPARATUS

BACKGROUND OF THE INVENTION

Field of the Invention

The present invention relates to a laser processing apparatus performing laser processing on a workpiece such as a semiconductor wafer or the like.

Description of the Related Art

In a semiconductor device manufacturing process, a plurality of regions are partitioned by scheduled division lines arranged in a lattice manner on the top surface of a semiconductor wafer in substantially the shape of a disk, and devices such as ICs, LSIs, or the like are formed in the partitioned regions. The regions in which the devices are formed are then divided from each other by cutting the semiconductor wafer along the scheduled division lines. The individual semiconductor devices are thus manufactured. In addition, an optical device wafer formed by stacking light receiving elements such as photodiodes or the like or light emitting elements such as laser diodes or the like on the top surface of a sapphire substrate is also cut along scheduled division lines, and thereby divided into individual optical devices such as the photodiodes, the laser diodes, and the like, which are widely used in electric devices.

Proposed as a method for dividing a wafer such as a semiconductor wafer, an optical device wafer, or the like as described above along scheduled division lines is a method of forming laser-processed grooves by applying a laser beam having a wavelength capable of being absorbed by the wafer along the scheduled division lines formed on the wafer and thus performing ablation processing, and breaking the wafer along the laser-processed grooves (see for example Japanese Patent Laid-Open No. 2010-272697).

SUMMARY OF THE INVENTION

However, when a laser-processed groove is formed by performing ablation processing on a wafer of silicon, sapphire, or the like as a workpiece, the silicon, the sapphire, or the like is melted to form a melt (debris). Because of the burying back of the melt, a laser-processed groove having a desired depth cannot be formed even when a laser beam is applied along a scheduled division line formed on the wafer.

It is accordingly an object of the present invention to provide a laser processing apparatus that can form a laser-processed groove having a desired depth by effectively processing a melt (debris) formed by irradiating a workpiece with a laser beam from a condenser.

In accordance with an aspect of the present invention, there is provided a laser processing apparatus including: a chuck table holding a workpiece; laser beam irradiating means irradiating the workpiece held on the chuck table with a laser beam, the laser beam irradiating means including laser beam oscillating means oscillating the laser beam and a condenser having a condensing lens condensing the laser beam oscillated by the laser beam oscillating means; and melt processing means processing a melt formed by laser processing, the melt processing means being disposed downstream of the condenser in a laser beam irradiating direction; the melt processing means including a gas injecting section having an opening allowing passage of the laser beam applied from the condenser, the gas injecting section injecting high-speed gas from the opening to the workpiece, and a melt sucking section having a suction port disposed so as to surround the opening of the gas injecting section, the suction port sucking the melt scattered by the high-speed gas injected from the opening; the gas injecting section being connected to high-pressure gas supply means, the melt sucking section being connected to melt sucking means.

Preferably, the high-pressure gas supply means supplies the gas such that a flow rate of the gas injected from the opening of the gas injecting section is 30 liters/minute·mm$^2$ to 200 liters/minute·mm$^2$.

In the laser processing apparatus according to the present invention, the gas injecting section of the melt processing means is connected to the high-pressure gas supply means, and the melt sucking section is connected to the melt sucking means. Thus, the high-speed gas injected from the opening of the gas injecting section scatters and removes, from a laser-processed groove, the melt produced by irradiating the workpiece with the laser beam. Hence, a laser-processed groove having a desired depth can be formed while the laser processing by the continuously applied pulsed laser beam progresses. In addition, the melt scattered from the laser-processed groove by the high-speed gas injected from the opening of the gas injecting section is sucked into the melt sucking means from the suction port of the melt sucking section disposed so as to surround the opening of the gas injecting section through a plurality of gas suction passages. Hence, the melt scattered from the laser-processed groove by the high-speed gas injected from the opening of the gas injecting section does not adhere to the top surface of the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
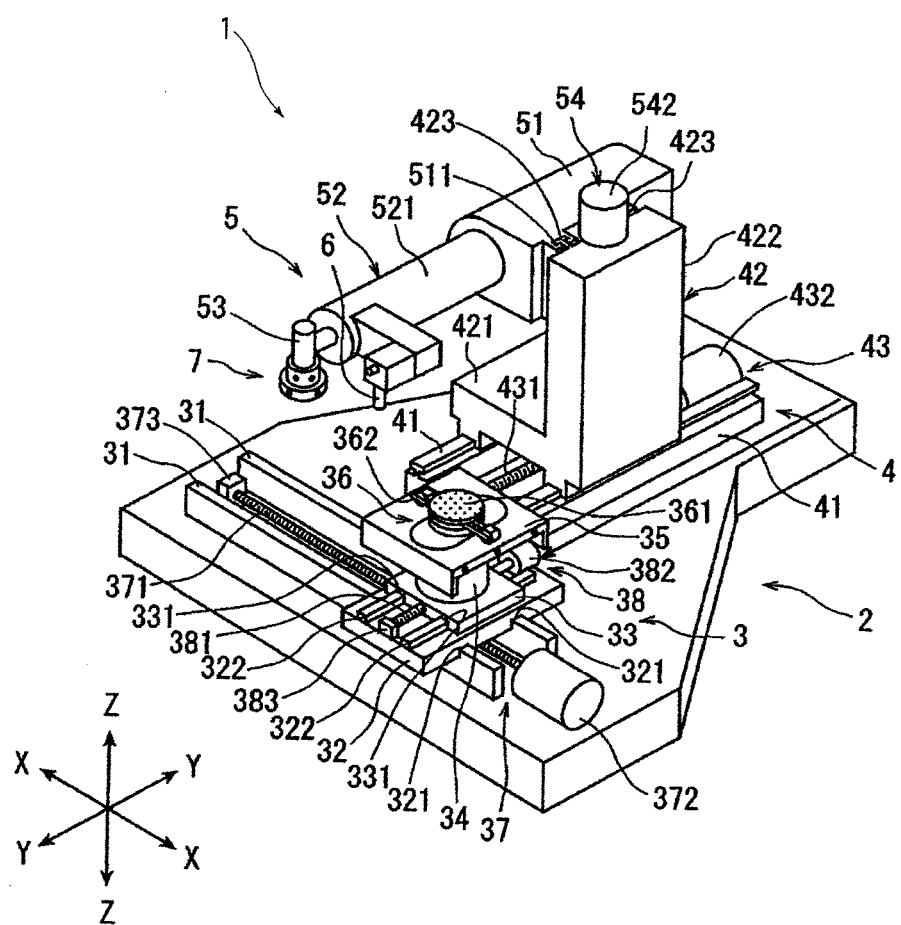
FIG. 1 is a perspective view of a laser processing apparatus according to an embodiment of the present invention.

A preferred embodiment of a laser processing apparatus configured according to the present invention will hereinafter be described in detail with reference to the accompanying drawings. FIG. 1 is a perspective view of a laser processing apparatus 1 configured according to the present invention. The laser processing apparatus 1 shown in FIG. 1 includes: a stationary base 2; a chuck table mechanism 3 disposed on the stationary base 2 so as to be movable in a processing feed direction indicated by an arrow X, the chuck table mechanism 3 holding a workpiece; a laser beam irradiation unit supporting mechanism 4 disposed on the stationary base 2 so as to be movable in an indexing feed direction indicated by an arrow Y which indexing feed direction is orthogonal to the direction indicated by the arrow X; and a laser beam irradiation unit 5 disposed on the laser beam unit supporting mechanism 4 so as to be movable in a direction indicated by an arrow Z.

The chuck table mechanism 3 includes: a pair of guide rails 31 arranged on the stationary base 2 in parallel with each other along the processing feed direction indicated by the arrow X; a first sliding block 32 disposed on the guide rails 31 so as to be movable in the processing feed direction indicated by the arrow X; a second sliding block 33 disposed on the first sliding block 32 so as to be movable in the indexing feed direction indicated by the arrow Y; a support table 35 supported over the second sliding block 33 by a cylindrical member 34; and a chuck table 36 as workpiece holding means. The chuck table 36 has a suction chuck 361 formed of a porous material. Suction means not shown in the figures holds a semiconductor wafer in the shape of a disk, for example, as a workpiece onto the suction chuck 361. The thus formed chuck table 36 is rotated by a pulse motor not shown in the figures which pulse motor is disposed within the cylindrical member 34. The chuck table 36 formed as described above is provided with a clamp 362 for fixing an annular frame to be described later.

The first sliding block 32 is provided with a pair of guided grooves 321 in an undersurface thereof, the pair of guided grooves 321 being fitted to the pair of guide rails 31, and is provided with a pair of guide rails 322 on a top surface thereof, the pair of guide rails 322 being formed in parallel with each other along the indexing feed direction indicated by the arrow Y. The thus formed first sliding block 32 is formed so as to be movable in the processing feed direction indicated by the arrow X along the pair of guide rails 31 by fitting the guided grooves 321 to the pair of guide rails 31. The chuck table mechanism 3 in the present embodiment has processing feed means 37 for moving the first sliding block 32 in the processing feed direction indicated by the arrow X along the pair of guide rails 31. The processing feed means 37 includes a male screw rod 371 disposed between and in parallel with the pair of guide rails 31 and a driving source such as a pulse motor 372 or the like for rotation-driving the male screw rod 371. One end of the male screw rod 371 is rotatably supported by a bearing block 373 fixed to the stationary base 2. Another end of the male screw rod 371 is transmissively coupled to an output shaft of the pulse motor 372. It is to be noted that the male screw rod 371 is screwed into a through female screw hole formed in a female screw block not shown in the figures which female screw block is provided in a projecting manner on the undersurface of a central portion of the first sliding block 32. Hence, the first sliding block 32 is moved in the processing feed direction indicated by the arrow X along the guide rails 31 by driving the male screw rod 371 for normal rotation and reverse rotation by the pulse motor 372.

The second sliding block 33 is provided with a pair of guided grooves 331 in an undersurface thereof, the pair of guided grooves 331 being fitted to the pair of guide rails 322 provided on the top surface of the first sliding block 32. The second sliding block 33 is formed so as to be movable in the indexing feed direction indicated by the arrow Y by fitting the guided grooves 331 to the pair of guide rails 322. The chuck table mechanism 3 includes first indexing feed means 38 for moving the second sliding block 33 in the indexing feed direction indicated by the arrow Y along the pair of guide rails 322 provided on the first sliding block 32. The first indexing feed means 38 includes a male screw rod 381 disposed between and in parallel with the pair of guide rails 322 and a driving source such as a pulse motor 382 or the like for rotation-driving the male screw rod 381. One end of the male screw rod 381 is rotatably supported by a bearing block 383 fixed to the top surface of the first sliding block 32. Another end of the male screw rod 381 is transmissively coupled to an output shaft of the pulse motor 382. It is to be noted that the male screw rod 381 is screwed into a through female screw hole formed in a female screw block not shown in the figures which female screw block is provided in a projecting manner on the undersurface of a central portion of the second sliding block 33. Hence, the second sliding block 33 is moved in the indexing feed direction indicated by the arrow Y along the guide rails 322 by driving the male screw rod 381 for normal rotation and reverse rotation by the pulse motor 382.

The laser beam irradiation unit supporting mechanism 4 includes: a pair of guide rails 41 disposed on the stationary base 2 so as to be parallel with each other along the indexing feed direction indicated by the arrow Y; and a movable support base 42 disposed on the guide rails 41 so as to be movable in the direction indicated by the arrow Y. The movable support base 42 includes: a moving support portion 421 disposed so as to be movable on the guide rails 41; and a mounting portion 422 attached to the moving support portion 421. The mounting portion 422 is provided on one side surface thereof with a pair of guide rails 423 parallel with each other which guide rails extend in the direction indicated by the arrow Z. The laser beam irradiation unit supporting mechanism 4 includes second indexing feed means 43 for moving the movable support base 42 in the indexing feed direction indicated by the arrow Y along the pair of guide rails 41. The second indexing feed means 43 includes: a male screw rod 431 disposed between and in parallel with the pair of guide rails 41; and a driving source such as a pulse motor 432 or the like for rotation-driving the male screw rod 431. One end of the male screw rod 431 is rotatably supported by a bearing block not shown in the figures which bearing block is fixed to the stationary base 2. Another end of the male screw rod 431 is transmissively coupled to an output shaft of the pulse motor 432. It is to be noted that the male screw rod 431 is screwed into a female screw hole formed in a female screw block not shown in the figures which female screw block is provided in a projecting manner on the undersurface of a central portion of the moving support portion 421 forming the movable support base 42. Hence, the movable support base 42 is moved in the indexing feed direction indicated by the arrow Y along the guide rails 41 by driving the male screw rod 431 for normal rotation and reverse rotation by the pulse motor 432.

The laser beam irradiation unit 5 in the present embodiment includes a unit holder 51 and laser beam irradiating means 52 attached to the unit holder 51. The unit holder 51 is provided with a pair of guided grooves 511 slidably fitted to the pair of guide rails 423 provided to the mounting portion 422. The unit holder 51 is supported so as to be movable in a focal point position adjusting direction indicated by the arrow Z by fitting the guided grooves 511 to the guide rails 423.

Figure 2:
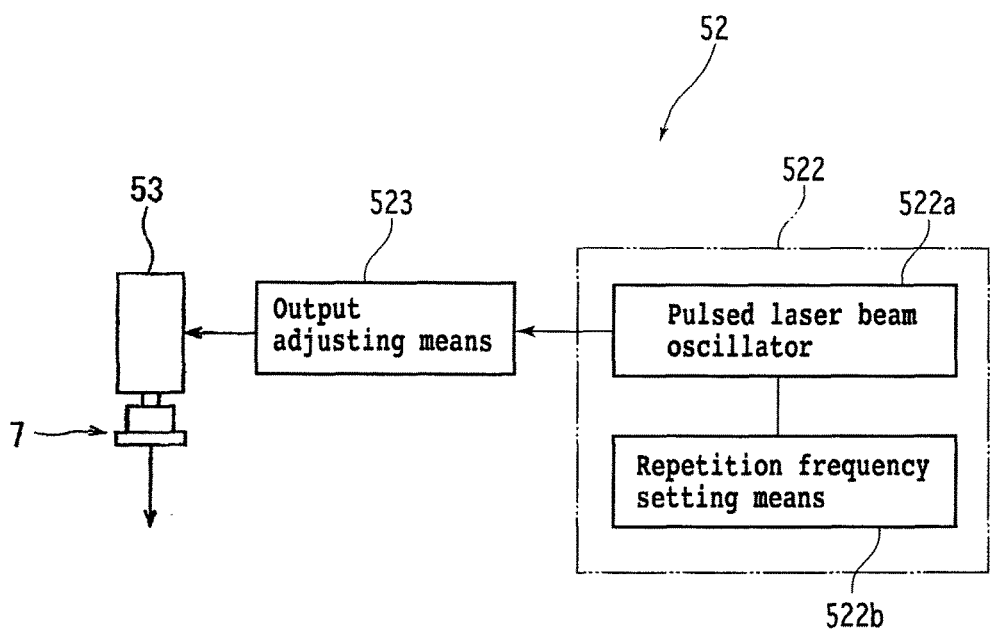
FIG. 2 is a block diagram schematically showing a configuration of laser beam irradiating means provided to the laser processing apparatus shown in FIG. 1.

The laser beam irradiating means 52 includes a cylindrical casing 521 fixed to the unit holder 51 and extending substantially horizontally. In addition, as shown in FIG. 2, the laser beam irradiating means 52 includes: pulsed laser beam oscillating means 522 for oscillating a pulsed laser beam, the pulsed laser beam oscillating means 522 being disposed within the casing 521; output adjusting means 523 for adjusting the output of the pulsed laser beam oscillated by the pulsed laser beam oscillating means 522; and a condenser 53 disposed at an end of the casing 521 and irradiating the workpiece held on the chuck table 36 with the pulsed laser beam oscillated by the pulsed laser beam oscillating means 522. The pulsed laser beam oscillating means 522 includes a pulsed laser beam oscillator 522*a* formed by a YAG laser oscillator or a YVO4 laser oscillator and repetition frequency setting means 522*b* attached to the pulsed laser beam oscillator 522*a*. As shown in FIG. 1, the condenser 53 is mounted on the end of the casing 521. This condenser 53 will be described later in detail.

Referring to FIG. 1 and continuing the description, imaging means 6 for imaging a processing region to be laser-processed by the laser beam irradiating means 52 is disposed on a front end portion of the casing 521 forming the laser beam irradiating means 52. This imaging means 6 is formed by an imaging element (CCD) or the like. The imaging means 6 sends an imaged image signal to control means not shown in the figures. It is to be noted that melt processing means 7 for processing a melt formed by irradiating the workpiece with the laser beam from the condenser 53 is disposed at a lower end portion of the condenser 53. This melt processing means 7 will be described later in detail.

The laser beam irradiation unit 5 includes moving means 54 for moving the unit holder 51 in the direction indicated by the arrow Z along the pair of guide rails 423. The moving means 54 includes: a male screw rod (not shown) disposed between the pair of guide rails 423; and a driving source such as a pulse motor 542 or the like for rotation-driving the male screw rod. The unit holder 51 and the laser beam irradiating means 52 are moved in the direction indicated by the arrow Z along the guide rails 423 by driving the male screw rod not shown in the figures for normal rotation and reverse rotation by the pulse motor 542. Incidentally, in the embodiment shown in the figures, the laser beam irradiating means 52 is moved upward by driving the pulse motor 542 for normal rotation, and the laser beam irradiating means 52 is moved downward by driving the pulse motor 542 for reverse rotation.

Figure 3:
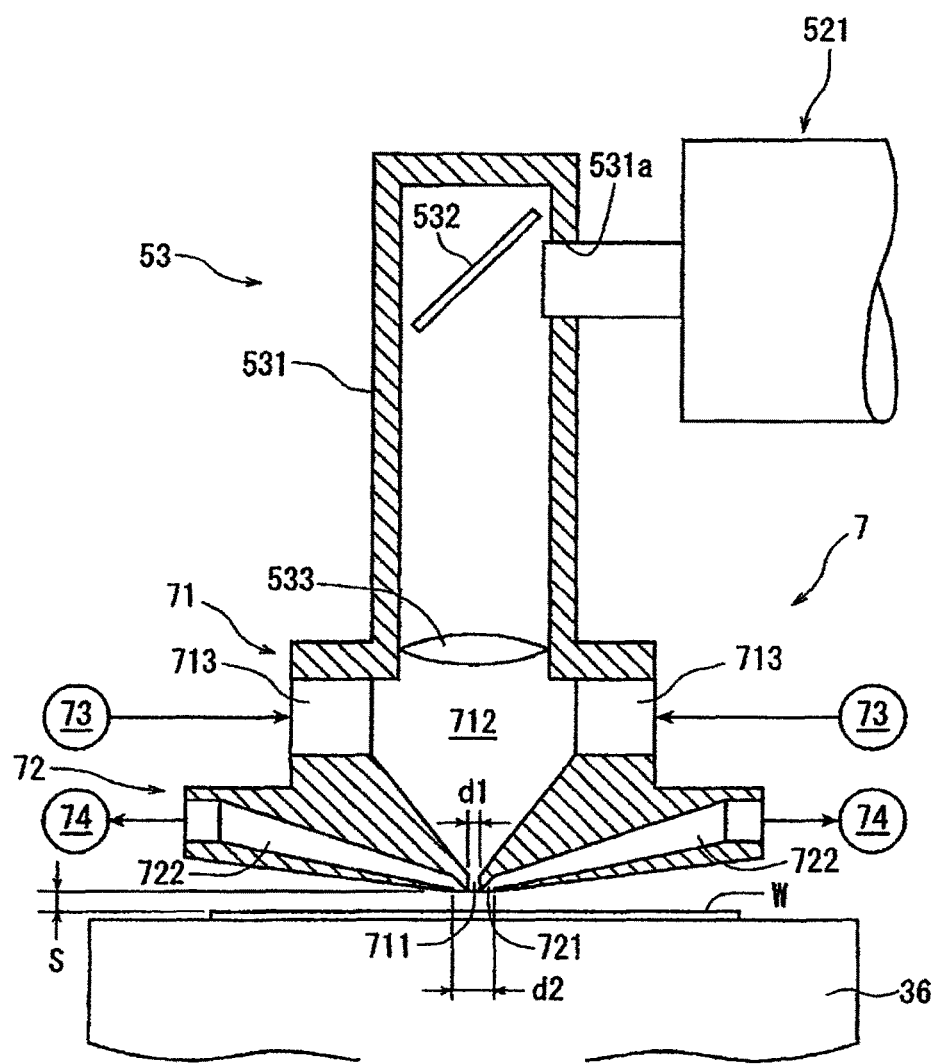
FIG. 3 is a sectional view of a condenser and melt processing means provided to the laser processing apparatus shown in FIG. 1.

The condenser 53 and the melt processing means 7 will next be described with reference to FIG. 3. The condenser 53 has a cylindrical condenser housing 531 whose upper end is closed. An upper portion of the condenser housing 531 is provided with an opening 531*a* into which an end portion of the casing 521 forming the laser beam irradiating means 52 is inserted. Disposed within the condenser housing 531 are a direction changing mirror 532 changing the direction of the pulsed laser beam oscillated by the pulsed laser beam oscillating means 522 to a downward direction and a condensing lens 533 condensing the pulsed laser beam whose direction is changed to the downward direction by the direction changing mirror 532 and irradiating a workpiece W held on the chuck table 36 with the condensed pulsed laser beam.

The melt processing means 7 for processing a melt formed by irradiating the workpiece W held on the chuck table 36 with the laser beam is disposed below the condenser housing 531 forming the condenser 53 described above, that is, downstream of the condenser housing 531 in the laser beam irradiating direction. This melt processing means 7 includes: a gas injecting section 71 having an opening 711 allowing the passage of the laser beam applied through the condensing lens 533 of the condenser 53, the gas injecting section 71 injecting a gas at high speed from the opening 711 to the workpiece W held on the chuck table 36; and a melt sucking section 72 having a suction port 721 provided so as to surround the opening 711 of the gas injecting section 71.

The gas injecting section 71 forming the melt processing means 7 has a gas chamber 712 between the undersurface of the condenser housing 531 and the opening 711. The gas chamber 712 is connected to high-pressure gas supply means 73 via a plurality of gas introducing ports 713. Incidentally, the diameter (d1) of the opening 711 forming the gas injecting section 71 is preferably set at 0.5 mm to 3 mm, and is set at 1 mm in the present embodiment. The high-pressure gas supply means 73 is formed by air supply means in the present embodiment, and is set such that 30 liters/(minute·mm$^2$) to 200 liters/(minute·mm$^2$) of air is injected from the opening 711.

The melt sucking section 72 forming the melt processing means 7 has a plurality of gas suction passages 722 communicating with the suction port 721. The plurality of gas suction passages 722 are connected to melt sucking means 74. Incidentally, the diameter (d2) of the suction port 721 forming the melt sucking section 72 is preferably set at 5 mm to 50 mm, and is set at 5 mm in the present embodiment. The melt sucking means 74 is formed by air sucking means in the embodiment shown in the figures, and is set such that 30 liters/(minute·mm$^2$) to 200 liters/(minute·mm$^2$) of air is sucked from the suction port 721.

The melt processing means 7 is formed as described above. When the laser beam irradiating means 52 is operated to perform laser processing on the workpiece W held on the chuck table 36, the laser processing is performed with an interval (S) from the lower ends of the opening 711 and the suction port 721 to the upper surface of the workpiece W in a range of 0.5 mm to 3 mm.

Figure 4:
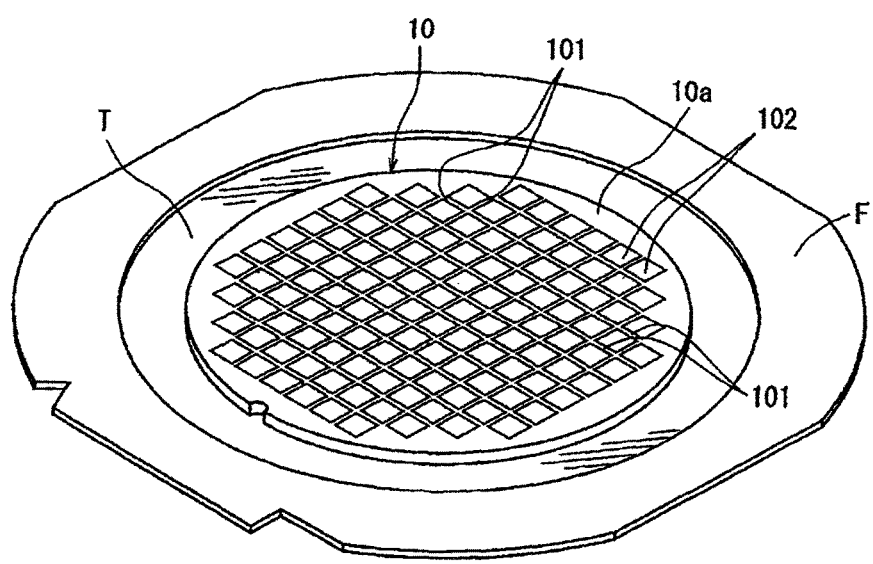
FIG. 4 is a perspective view of a state in which a semiconductor wafer as a workpiece is stuck to the top surface of a dicing tape fitted to an annular frame.

The laser processing apparatus 1 in the present embodiment is formed as described above. The action of the laser processing apparatus 1 will be described in the following. FIG. 4 is a perspective view showing a state in which a semiconductor wafer 10 as a workpiece to be processed by the above-described laser processing apparatus is stuck to the top surface of a dicing tape T fitted to an annular frame F. Scheduled division lines 101 in a lattice manner are formed on a top surface 10*a* of the semiconductor wafer 10, and devices 102 such as ICs, LSIs, or the like are formed in a plurality of regions partitioned by the scheduled division lines 101 in the lattice manner. In order to form laser-processed grooves along the scheduled division lines 101 on the thus formed semiconductor wafer 10, the dicing tape T side of the semiconductor wafer 10 is mounted on the chuck table 36 of the laser processing apparatus shown in FIG. 1. Then, the semiconductor wafer 10 is sucked and held onto the chuck table 36 via the dicing tape T by actuating the suction means not shown in the figures (wafer holding step). Incidentally, the annular frame F that supports the semiconductor wafer 10 via the dicing tape T is fixed by the clamp 362 disposed on the chuck table 36.

After the above-described wafer holding step is performed, the processing feed means 37 is actuated to position the chuck table 36 sucking and holding the semiconductor wafer 10 directly under the imaging means 6. After the chuck table 36 is positioned directly under the imaging means 6, the imaging means 6 and the control means not shown in the figures perform an alignment operation in which a processing region to be laser-processed in the semiconductor wafer 10 is detected. Specifically, the imaging means 6 and the control means not shown in the figures perform image processing such as pattern matching or the like for alignment with the condenser 53 of the laser beam irradiating means 52 for applying a laser beam along a scheduled division line 101 formed in a predetermined direction on the semiconductor wafer 10, and thereby carry out alignment of a laser beam irradiation position. In addition, the alignment of the laser beam irradiation position is similarly carried out for a scheduled division line 101 formed in a direction orthogonal to the predetermined direction on the semiconductor wafer 10.

Figure 5A:
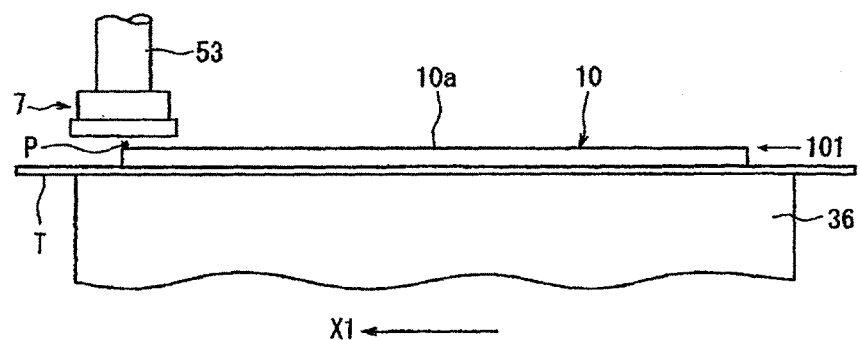
FIGS. 5A to 5C are diagrams of assistance in explaining a laser-processed groove forming step performed by the laser processing apparatus shown in FIG. 1.
Figure 5B:
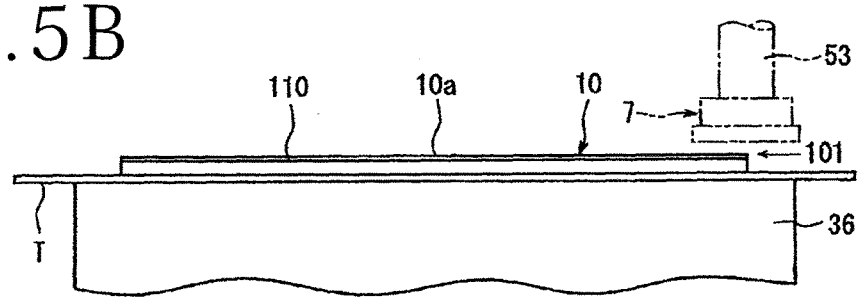
Figure 5C:
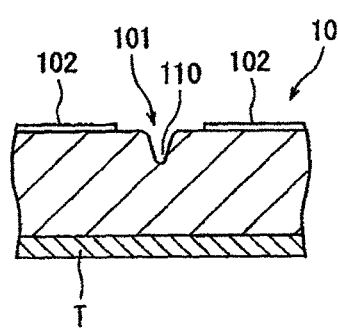

After the scheduled division line formed on the semiconductor wafer 10 held on the chuck table 36 is detected and the alignment of the laser beam irradiation position is performed as described above, as shown in FIG. 5A, the chuck table 36 is moved to a laser beam irradiation region in which the condenser 53 of the laser beam irradiating means 52 is located, and one end (left end in FIG. 5A) of a predetermined scheduled division line is positioned directly under the condenser 53. Then, a focal point P of the pulsed laser beam applied from the condenser 53 is set in the vicinity of the top surface (upper surface) of the semiconductor wafer 10. Next, the chuck table 36 is moved in a direction indicated by an arrow X1 in FIG. 5A at a predetermined processing feed speed while the pulsed laser beam having a wavelength capable of being absorbed by the semiconductor wafer is applied from the condenser 53 of the laser beam irradiating means 52. Then, when another end (right end in FIG. 5B) of the scheduled division line 101 has reached a position directly under the condenser 53, the application of the pulsed laser beam is stopped, and the movement of the chuck table 36 is stopped. As a result, as shown in FIG. 5B and FIG. 5C, a laser-processed groove 110 is formed along the scheduled division line 101 on the semiconductor wafer 10 (laser-processed groove forming step).

Incidentally, the laser-processed groove forming step is performed under the following processing conditions, for example.

Figure 6:
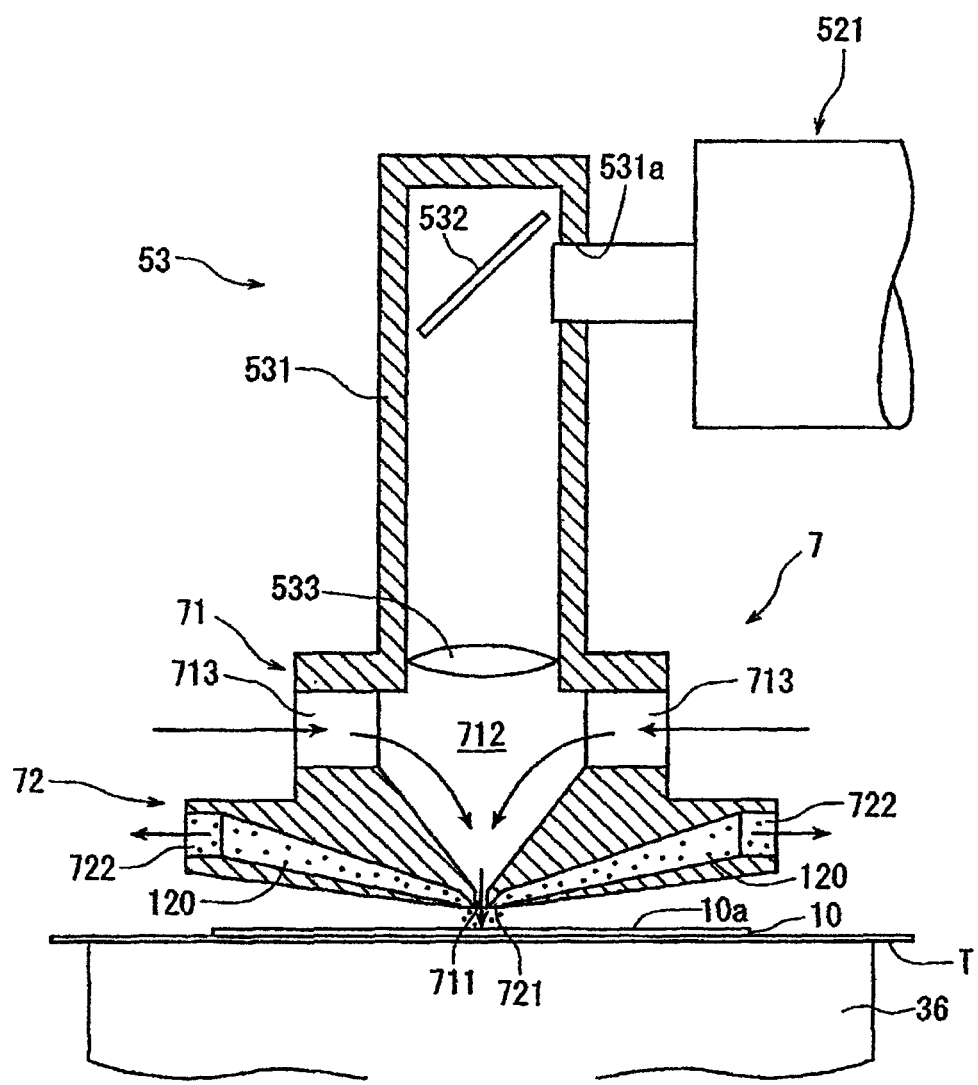
FIG. 6 is a sectional view of the melt processing means in a state in which the laser-processed groove forming step is being performed.

<Processing Condition: 1>
Laser beam light source: YVO4 laser or YAG laser
Wavelength: 355 nm
Repetition frequency: 800 kHz
Average output: 8 W
Condensed spot diameter: 10 µm
Processing feed speed: 400 mm/second
<Processing Condition: 2>
Laser beam light source: $CO_2$ laser
Repetition frequency: 20 kHz
Average output: 20 W
Condensed spot diameter: 100 µm
Processing feed speed: 600 mm/second In the laser-processed groove forming step described above, the irradiation of the top surface of the semiconductor wafer 10 with the pulsed laser beam from the condenser 53 melts the semiconductor wafer and thus produces a melt such as debris or the like. However, because the foregoing embodiment has the above-described melt processing means 7, the high-speed gas (air) injected from the opening 711 of the gas injecting section 71 scatters and removes, from the laser-processed groove 110, the melt 120 produced by irradiating the semiconductor wafer 10 with the pulsed laser beam, as shown in FIG. 6. Thus, the laser-processed groove 110 having a desired depth can be formed while laser processing by the continuously applied pulsed laser beam progresses. The melt 120 scattered from the laser-processed groove 110 by the high-speed gas (air) injected from the opening 711 of the gas injecting section 71 is sucked into the melt sucking means 74 from the suction port 721 of the melt sucking section 72 which suction port is disposed so as to surround the opening 711 of the gas injecting section 71 through the plurality of gas suction passages 722. Hence, the melt 120 scattered from the laser-processed groove 110 by the high-speed gas (air) injected from the opening 711 of the gas injecting section 71 does not adhere to the top surface of the semiconductor wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A laser processing apparatus comprising:
a chuck table holding a workpiece;
a laser beam irradiating means irradiating the workpiece held on the chuck table with a laser beam, the laser beam irradiating means including a laser beam oscillating means oscillating the laser beam and a condenser having a condensing lens condensing the laser beam oscillated by the laser beam oscillating means;
a melt processing means processing a melt formed by laser processing, the melt processing means being disposed downstream of the condenser in a laser beam irradiating direction;
the melt processing means including a gas injecting section having an opening allowing passage of the laser beam applied from the condenser, the gas injecting section injecting high-speed gas from the opening to the workpiece, and a melt sucking section having a suction port disposed so as to surround the opening of the gas injecting section, the suction port sucking the melt scattered by the high-speed gas injected from the opening;
the distance from the lowermost edge of the opening to the workpiece is the same as the distance between the lowermost edge of the suction port and the workpiece;
the gas injecting section being connected to a high-pressure gas supply means that provides the high-speed gas to the workpiece, and the melt sucking section being connected to a melt sucking means that provides suction for sucking the melt scattered by the high-speed gas;
wherein the suction port defines a radially outermost opening facing the workpiece;
wherein the melt sucking section includes a plurality of gas suction passages for connecting the suction port to the melt sucking means; wherein the gas suction passages extend radially outwardly from the suction port;
wherein the lowermost edge of the suction-port surrounds and is separated from the lowermost edge of the opening; and
further wherein the melt sucking section is configured and arranged to pass the melt in a radial direction from the suction port through the gas suction passages.
2. The laser processing apparatus according to claim 1, wherein the high-pressure gas supply means supplies the gas such that a flow rate of the gas injected from the opening of the gas injecting section is 30 liters/minute·mm$^2$ to 200 liters/minute·mm$^2$.
3. The laser processing apparatus according to claim 1, wherein:
the opening has a diameter that is between 0.5 mm and 3.0 mm;
the suction port has a diameter that is between 5 mm and 50 mm.

4. The laser processing apparatus according to claim 3, wherein:
the diameter of the opening is 1 mm;
the diameter of the suction port is 5 mm.

5. The laser processing apparatus according to claim 1, wherein the distance from the opening to the workpiece and the distance between the suction port and the workpiece are both defined as the interval S, and the interval S is in the range of 0.5 mm to 3 mm.

6. The laser processing apparatus according to claim 1, wherein the gas sucking passages extend radially outwardly from the suction port by a distance that is greater than a distance between the gas sucking passages and the workpiece.

7. The laser processing apparatus according to claim 1, wherein the melt sucking means is set to a flow rate of 30 liters/minute·mm² to 200 liters/minute·mm².

8. The laser processing apparatus according to claim 1, wherein:
said gas injecting section includes a gas chamber between the condenser lens and the opening; and
said gas chamber is connected to the high-pressure gas supply means via a plurality of gas introducing ports, and
wherein gas provided from the high-pressure gas supply means passes from the gas introducing ports, into the gas chamber, and then out through the opening.

9. A laser processing apparatus comprising:
a chuck table holding a workpiece;
a laser beam irradiating means irradiating the workpiece held on the chuck table with a laser beam, the laser beam irradiating means including a laser beam oscillating means oscillating the laser beam and a condenser having a condensing lens condensing the laser beam oscillated by the laser beam oscillating means;
a melt processing means processing a melt formed by laser processing, the melt processing means being disposed downstream of the condenser in a laser beam irradiating direction; the melt processing means including a gas injecting section having an opening allowing passage of the laser beam applied from the condenser, the gas injecting section injecting high-speed gas from the opening to the workpiece, and a melt sucking section having a suction port disposed so as to surround the opening of the gas injecting section, the suction port sucking the melt scattered by the high-speed gas injected from the opening;
the distance from the lowermost edge of the opening to the workpiece is the same as the distance between the lowermost edge of the suction port and the workpiece;
the gas injecting section being connected to a high-pressure gas supply means that provides the high-speed gas to the workpiece, the melt sucking section being connected to a melt sucking means that provides suction for sucking the melt scattered by the high-speed gas;
said gas injecting section includes a gas chamber between the condenser lens and the opening;
said gas chamber is connected to the high-pressure gas supply means via a plurality of gas introducing ports;
wherein gas provided from the high-pressure gas supply means passes from the gas introducing ports, into the gas chamber, and then out through the opening;
wherein the melt sucking section includes a plurality of gas suction passages for connecting the suction port to the melt sucking means;
wherein the lowermost edge of the suction port surrounds and is separated from the lowermost edge of the opening; and
wherein the gas suction passages extend radially outwardly from the suction port; and further wherein the melt sucking section is configured and arranged to pass the melt in a radial direction from the suction port through the gas suction passages.

10. The laser processing apparatus according to claim 9, wherein the high-pressure gas supply means supplies the gas such that a flow rate of the gas injected from the opening of the gas injecting section is 30 liters/minute·mm² to 200 liters/minute·mm².

11. The laser processing apparatus according to claim 9, wherein:
the opening has a diameter that is between 0.5 mm and 3.0 mm;
the suction port has a diameter that is between 5 mm and 50 mm.

12. The laser processing apparatus according to claim 11, wherein:
the diameter of the opening is 1 mm;
the diameter of the suction port is 5 mm.

13. The laser processing apparatus according to claim 9, wherein the distance from the opening to the workpiece and the distance between the suction port and the workpiece are both defined as the interval S, and the interval S is in the range of 0.5 mm to 3 mm.

14. The laser processing apparatus according to claim 9, wherein the gas sucking passages extend radially outwardly from the suction port by a distance that is greater than a distance between the gas sucking passages and the workpiece.

15. The laser processing apparatus according to claim 9, wherein the melt sucking means is set to a flow rate of 30 liters/minute·mm² to 200 liters/minute·mm².

* * * * *